United States Patent
Miller et al.

(10) Patent No.: US 10,246,243 B1
(45) Date of Patent: Apr. 2, 2019

(54) APPARATUS AND METHOD FOR ACTIVE HEAT REMOVAL FROM A HEAT RESISTANT CONTAINER

(71) Applicant: Honeywell International Inc., Morris Plains, NJ (US)

(72) Inventors: David Lowell Miller, Kirkland, WA (US); Gary Kersten, Duvall, WA (US); Kendall McAdams, Seattle, WA (US)

(73) Assignee: Honeywell International Inc., Morris Plains, NJ (US)

(*) Notice: Subject to any disclaimer, the term of this patent is extended or adjusted under 35 U.S.C. 154(b) by 0 days.

(21) Appl. No.: 15/790,832

(22) Filed: Oct. 23, 2017

(51) Int. Cl.
*B65D 81/38* (2006.01)
*B65D 85/30* (2006.01)
*G06F 1/20* (2006.01)
*H01L 35/30* (2006.01)
*H04B 1/3822* (2015.01)
*G07C 5/00* (2006.01)
*G06F 1/18* (2006.01)
*G07C 5/08* (2006.01)

(52) U.S. Cl.
CPC ............ *B65D 81/38* (2013.01); *B65D 85/30* (2013.01); *G06F 1/182* (2013.01); *G06F 1/20* (2013.01); *G07C 5/008* (2013.01); *G07C 5/085* (2013.01); *H01L 35/30* (2013.01); *H04B 1/3822* (2013.01)

(58) Field of Classification Search
CPC .. H04B 5/0031; H04B 5/0037; H04B 5/0062; H05K 5/0213; G07C 5/085; H01Q 1/40; H01Q 1/24; H01Q 1/28; B64D 2045/0065
See application file for complete search history.

(56) References Cited

U.S. PATENT DOCUMENTS

| | | | |
|---|---|---|---|
| 5,438,162 A | 8/1995 | Thompson et al. | |
| 6,899,161 B2* | 5/2005 | Ren | C09K 5/16 165/10 |
| 7,002,800 B2 | 2/2006 | Elias et al. | |
| 7,703,291 B2* | 4/2010 | Bushnik | G01D 3/08 62/259.2 |
| 7,875,812 B2* | 1/2011 | Steffler | H05K 5/0213 174/541 |
| 8,165,730 B2* | 4/2012 | Winterhalter | G07C 5/085 701/3 |
| 8,605,414 B2* | 12/2013 | Moore | G06F 1/182 361/679.02 |
| 8,723,057 B2 | 5/2014 | Miller et al. | |

(Continued)

FOREIGN PATENT DOCUMENTS

CA 2755579 A1 10/2010

OTHER PUBLICATIONS

Tewolde et al., Sensors for Small Modular Reactors Powered by Thermoelectric Generators, Proceedings of the ASME 2014 Small Modular Reactors Symposium, Apr. 15-17, 2014, pp. 1-5, Publisher: ASME.

*Primary Examiner* — Timothy Thompson
*Assistant Examiner* — Michael F McAllister
(74) *Attorney, Agent, or Firm* — Fogg & Powers LLC

(57) ABSTRACT

A method is provided. The method comprises: receiving thermal energy at a heat resistant container; converting all or a portion of the received thermal energy into electric energy; converting the electric energy into electromagnetic energy; and radiating the electromagnetic energy.

11 Claims, 3 Drawing Sheets

(56) References Cited

U.S. PATENT DOCUMENTS

| | | | | |
|---|---|---|---|---|
| 8,859,063 | B2 * | 10/2014 | Miller | H05K 5/0213 |
| | | | | 428/35.3 |
| 9,449,440 | B2 * | 9/2016 | Miller | H04B 5/0031 |
| 9,505,550 | B2 | 11/2016 | Miller et al. | |
| 9,778,868 | B1 * | 10/2017 | Theriault | G06F 3/0619 |
| 2003/0206102 | A1 * | 11/2003 | Joao | B60R 25/102 |
| | | | | 340/539.1 |
| 2006/0232891 | A1 * | 10/2006 | Bushnik | G01D 3/08 |
| | | | | 360/265.6 |
| 2007/0072639 | A1 * | 3/2007 | Frost | G07C 5/008 |
| | | | | 455/550.1 |
| 2009/0050365 | A1 * | 2/2009 | Moore | G11B 33/142 |
| | | | | 174/547 |
| 2009/0219679 | A1 * | 9/2009 | Moore | G06F 1/182 |
| | | | | 361/679.31 |
| 2009/0277683 | A1 * | 11/2009 | Winterhalter | B64D 45/00 |
| | | | | 174/546 |
| 2014/0020878 | A1 * | 1/2014 | Miller | H05K 5/0213 |
| | | | | 165/185 |
| 2014/0022722 | A1 * | 1/2014 | Miller | H05K 5/0213 |
| | | | | 361/679.36 |

\* cited by examiner

APPARATUS AND METHOD FOR ACTIVE HEAT REMOVAL FROM A HEAT RESISTANT CONTAINER

BACKGROUND

Vehicle recorders require mechanical robustness and the ability to survive in an environment of high thermal energy for a limited duration. Direct exposure to high temperatures can cause a crash survivable memory system, in the vehicle recorder, to fail. Current vehicle recorders are designed to passively protect, from heat, the crash survivable memory system. Passive heat protection is accomplished by adding thermal insulation to the vehicle recorder to shield the crash survivable memory system from external high temperatures. Such insulation can be bulky, and undesirably increase the weight and size of the vehicle recorder. Therefore, there is a need to reduce weight and size of the vehicle recorder while still adequately thermally insulating the crash survivable memory system.

SUMMARY

A method is provided. The method comprises: receiving thermal energy at a heat resistant container; converting all or a portion of the received thermal energy into electric energy; converting the electric energy into electromagnetic energy; and radiating the electromagnetic energy.

BRIEF DESCRIPTION OF THE DRAWINGS

Features of the present invention will become apparent to those skilled in the art from the following description with reference to the drawings. Understanding that the drawings depict only typical embodiments and are not therefore to be considered limiting in scope, the invention will be described with additional specificity and detail through the use of the accompanying drawings, in which.

DETAILED DESCRIPTION

Figure 1:
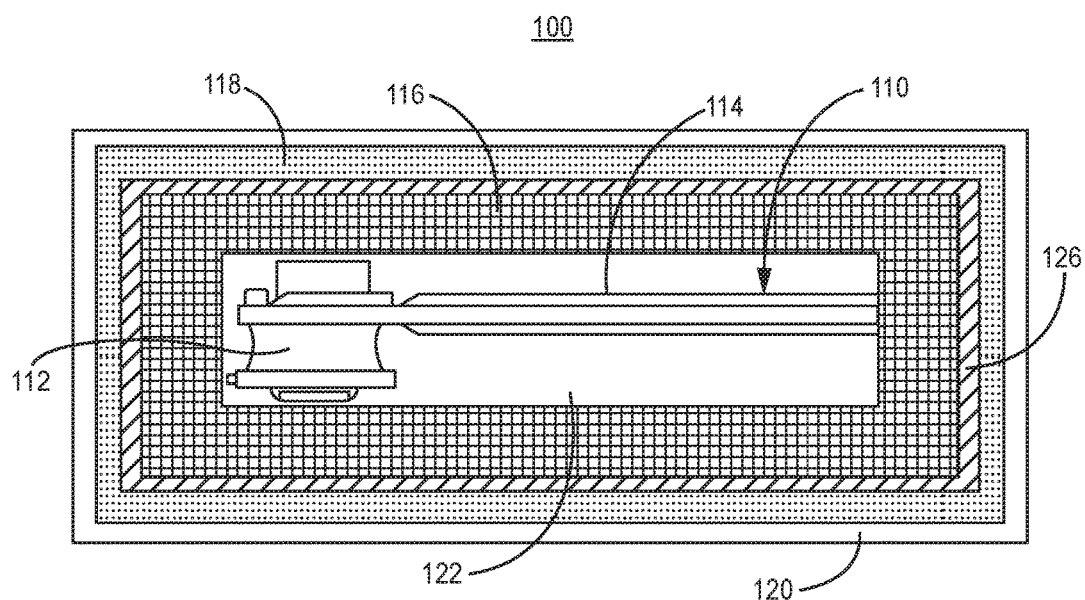
FIG. 1 is a cross-sectional view of one embodiment of a vehicle recorder including a thermoelectric generation system.

In the following detailed description, embodiments are described in sufficient detail to enable those skilled in the art to practice the invention. It is to be understood that other embodiments may be utilized without departing from the scope of the invention. The following detailed description is, therefore, not to be taken in a limiting sense.

A heat resistant container is configured to hold protected content. In one embodiment, the heat resistant container is a vehicle recorder including a crash survivable memory system (CSMS). The CSMS is configured to record and store vehicle operation data. The heat resistant container is designed to withstand an extreme environment, including high temperatures, present during an explosion or fire which, for example, may occur as a result of a vehicle crash or a building fire. The heat resistant container may also be impact resistant, and/or otherwise mechanically secure, to shield its protected content from damage from such impact or undesired removal from the heat resistant container.

Heat is actively removed from the heat resistant container by converting thermal energy into electromagnetic energy. The electromagnetic energy is radiated away from the heat resistant container. Thus, the heat resistant container must be permeable to an electromagnetic spectrum radiated by transmitter system.

The converted thermal energy does not substantially contribute to an increase in temperature within the heat resistant container, e.g. the vehicle recorder, and of the protected content. The protected content are item(s) to be shielded from heat such as the CSMS, papers, or any other material sensitive to, e.g. potentially damaged by, heat. Further, active removal of heat can diminish the required thermal insulation of the heat resistant container. As a result, a thermal insulator may not be required in the vehicle recorder. Alternatively, the dimensions of the thermal insulator and/or heat absorber(s) may be diminished. The present approach departs from conventional designs by increasing the thermal protection of the CSMS by active removal of heat.

The vehicle recorder may be employed in airborne vehicles, such as aircraft and helicopters, space borne vehicles such as spacecraft, terrestrial vehicles such as automobiles, trucks, and trains, seaborne vehicles such as ships, submersibles such as submarines, and any other type of vehicle.

For pedagogical reasons, the heat resistant container will be described as a vehicle recorder, and the protected contents will be described as a CSMS. However, the following description (with some variation) applies generally to heat resistant containers and their contents. The heat resistant container may be used to protect instrumentation or recording devices other than described below. Also, the heat resistant container may be a safe, e.g. a fire safe, used to protect a variety of contents such as papers; however, there may be no need for a transceiver system described below in such a safe.

Further details of various embodiments are described hereafter with reference to the drawings. FIG. 1 is a cross-sectional view of one embodiment of a vehicle recorder including a thermoelectric generation system (vehicle recorder) 100. The recorder 100 is an electronic device that records instructions sent to electronic systems on the vehicle. In one exemplary implementation, the vehicle recorder 100 can be a flight recorder and can include one or more of a flight data recorder, a cockpit voice recorder, an image recorder, a datalink recorder, and the like. In some implementations, the vehicle recorder 100 can record audio and/or video images in certain locations of the vehicle, such as an aircraft cockpit.

The vehicle recorder 100 includes a survivable memory system (CSMS) 110. The CSMS 110 comprises a transmitter system 112 and a crash protected memory system (CPMS) 114. In other embodiments, the CSMS 110 may include other electronic or electrical systems, such as one or more processor(s), computer(s), and/or other state machine(s), e.g. which may direct the operation of the CSMS 110.

Only one transmitter system 112 is described herein for pedagogical reasons. However, the vehicle recorder 100 may include more than one transmitter system 112. Correspondingly, the vehicle recorder 100 may include additional electromagnetic permeable windows through which the additional transmitter systems may radiate electromagnet power out of the vehicle recorder 100.

The transmitter system 112 converts electrical power into electromagnetic energy that is then radiated from the vehicle recorder 100 into free space. There is no intended receiver for such radiated electromagnetic energy. In one embodiment, the transmitter system 112 is an RF transmitter system, e.g. operating at one or more frequencies between the ultralow frequency band and the millimeter frequency band. Such a transmitter system may comprise an RF oscillator circuit coupled to an antenna, such as a patch antenna. In another embodiment, an amplifier may be coupled between the RF oscillator circuit and the antenna to generate higher electromagnetic energy levels. The RF oscillator generates an RF electromagnetic signal. The antenna is designed to radiate the generated electromagnetic energy outside of the vehicle recorder. The RF oscillator circuit and/or the amplifier are designed to be efficient and not generate significant thermal energy. In a further embodiment, the circuitry may be implemented with material, Gallium Nitride (GaN), resistant to high temperatures; for example, such circuitry can be implemented with GaN integrated circuits.

Alternatively, in another embodiment, the transmitter system 112 is an optical transmitter system, e.g. operating at one or more frequencies in the visible light spectrum. In this embodiment, the optical transmitter system may be a laser, e.g. a semiconductor laser. In a further embodiment, the laser may be made from GaN. The optical transmitter system is designed to radiate the generated electromagnetic energy outside of the vehicle recorder.

In order to preserve data that has been recorded in the CPMS 114, vehicle recorder 100 is designed to withstand the extreme environment that can occur during vehicle crashes. To ensure that CSMS 110 is able to withstand such extreme environments, vehicle recorder 100 includes various protective layers that function together to protect the CPMS 114 from being damaged by the shock and heat that occurs, for example, during an airplane crash.

In the embodiment shown in FIG. 1, the CSMS 110, e.g. the CPMS 114, can be substantially (for example completely) surrounded by a first heat absorber 116. Optionally, in another embodiment, a second heat absorber 122 can be packed between the first heat absorber 116 and the CSMS 110, e.g. substantially or completely surrounding the CSMS 110, e.g. the CPMS 114.

The first heat absorber 116 is, completely or partially, surrounded, by a thermoelectric generation system 126. Optionally, in one embodiment, the thermoelectric generation system 126 is, e.g. substantially or completely, surrounded by a thermal insulator 118. In addition, an impact resistant enclosure 120, e.g. completely, surrounds the CSMS 110 (e.g. the CPMS 114), the second heat absorber 122 (if used), the first heat absorber 116, thermal insulator 118 (if used), and the thermoelectric generation system 126. The combination of the impact resistant enclosure 120, the thermoelectric generation system 126, the first heat absorber 116, the second heat absorber and/or the thermal insulator 118 protects the CSMS 110 (e.g. the CPMS 114) from the extreme forces and heat that can occur during a vehicle crash. In other embodiments, more or fewer protection layers, and even a single homogenous protection layer, can be implemented.

The impact resistant enclosure 120 may be in the shape of a cuboid, e.g. a rectangular cuboid. However, other shapes may be used. The shape of the impact resistant enclosure 120, and thus the vehicle recorder 100, may be defined by industry standard, or the system or vehicle into which the vehicle recorder 100 is placed. The shape of the impact resistant enclosure 120 may, but will not always, define the shape of components within the impact resistant enclosure 120 such as the thermoelectric generation system 126, the thermal insulator 118 (if used), and the first heat absorber 116. For example, the CSMS 110 may be have a cylindrical shape. The minimum dimensions of the CSMS 110 may be defined by regulation.

In one embodiment, the thermoelectric generation system 126 comprises a Peltier cooling system operated as an electric generator. In another embodiment, the Peltier cooling system is implemented by one or more pairs of n-type and p-type semiconductors. Preferably, the semiconductors have both a low thermal conductivity and a high-power factor, such as bismuth telluride, lead telluride, and silicon germanium. Each pair is placed thermally in parallel and electrically in series, and has a first side and a second side (opposite the first side). When a temperature gradient forms across the first and second side, a current (typically proportional to the temperature gradient) flows through the pair, and can be supplied by an electrical load. The temperature of the thermoelectric generation system 126 proximate to the CSMS 110 is cooled by the first heat absorber 116 and/or the second heat absorber 122. Pairs can be placed in series and/or parallel to vary the current and voltage supplied by thermoelectric generation system 126.

The first heat absorber 116 (and the second heat absorber 122 (if used)) absorb heat, thus preventing heat from reaching the CPMS 114 and increasing the temperature of the CPMS 114. In one embodiment, the second heat absorber 122 comprises a phase change material, such as hydrocarbons, organic molecules, fatty acids, salt hydrates, and/or bicarbonate of soda. In another embodiment, the first heat absorption layer 116 can include a metallic microlattice in which truss elements provide a compressible scaffolding layer around CPMS 114. In a further embodiment, the metallic microlattice is formed from nickel. In yet another embodiment, the metallic microlattice can be impregnated with heat absorption material that includes the phase change material described above. The metallic microlattice distributes heat throughout the heat absorption material to impede thermal energy from reaching CPMS 114. An exemplary metallic microlattice for use in vehicle recorders 100 is described in further detail in U.S. Pat. Nos. 8,723,057 and 9,505,550, which are incorporated herein by reference in their entirety. Alternatively, the first heat absorption layer 116 can be implemented with the aforementioned phase change material.

In one embodiment, the thermal insulator 118 comprises a ceramic. In another embodiment, the thermal insulator 118 comprises a flexible aerogel that substantially, e.g. completely, surrounds the first heat absorber 116. One example of a flexible aerogel is an x-aerogel such as a silica x-aerogel with polystyrene.

The thermal insulator 118, the first heat absorber 116, the thermoelectric generation system 126, and the second heat absorber 122 (if used) function together to inhibit heat from reaching, and undermining the operation of and/or damaging, the CPMS 114. The thermal insulator 118 inhibits the transfer of heat to the first heat absorber 116 (and thus the second heat absorber 122 (if used) and the CPMS 114). The heat that passes through thermal insulator 118 is absorbed and converted, at least in part, by the thermoelectric generation system 126. The heat that passes through thermoelectric generation system 126 is absorbed, at least in part, by the first heat absorber 116. Heat that passes through the first heat absorber 116 is absorbed, at least in part, by the second heat absorber 122 (if used), or if no second heat absorber 122 is used, then impinges upon the CPMS 114. Heat that passes through the second heat absorber 122 (if used), impinges upon the CPMS 114.

Further, in one embodiment, the thermal insulator 118, the first heat absorber 116, and/or the second heat absorber 122 (if used) can prevent shocks to CSMS 110 from undermining the operation of and/or damaging CPMS 114. In this embodiment, the first heat absorber 116, the second heat absorber 122 (if used) and/or thermal insulator 118 are deformable in response to shocks. This allows the first heat absorber 116, the second heat absorber 122 (if used) and/or the thermal insulator 118 to absorb the energy produced by shocks applied to vehicle recorder 110 hereby preventing diminished operation by or damage to the CPMS 114.

The impact resistant enclosure 120 is composed of an impact resistant material that will not fracture due to stress from forces that may be applied to the vehicle recorder, e.g. during a crash. The impact resistant enclosure 120 is made wholly or partially of material permeable to electromagnetic energy (at the frequency being broadcast by the transmitter system 112) while being impact resistant; the permeable, yet impact resistance, material must be located proximate to the transmitter system 112 to facilitate radiation of the electromagnetic energy outside of the impact resistant enclosure 120. In one embodiment, such material permeable to RF may be a ceramic and/or a composite material such as graphene. In another embodiment, such material permeable to optical frequencies may be diamond. Such permeable material may be implemented as a window proximate to the transmitter system, e.g. an antenna of the transmitter system 112, or laser; the remainder of the impact resistant enclosure 120 may be comprised of other impact resistant material, such as metal or a metal alloy (for example steel), that is used to form the impact resistant enclosure 120 and is not permeable to electromagnetic energy in the frequency spectrum radiated by the transmitter system 112. In a further embodiment, to facilitate radiation of electromagnetic energy outside of the vehicle recorder 100, a portion of the transmitter system, such as the antenna may be placed proximate to impact resistant enclosure 120 or the window therein. In yet another embodiment, the impact resistant enclosure 120 can be hermetically sealed while permitting transmissivity of the electromagnetic energy radiated by the transmitter system 112.

Figure 2:
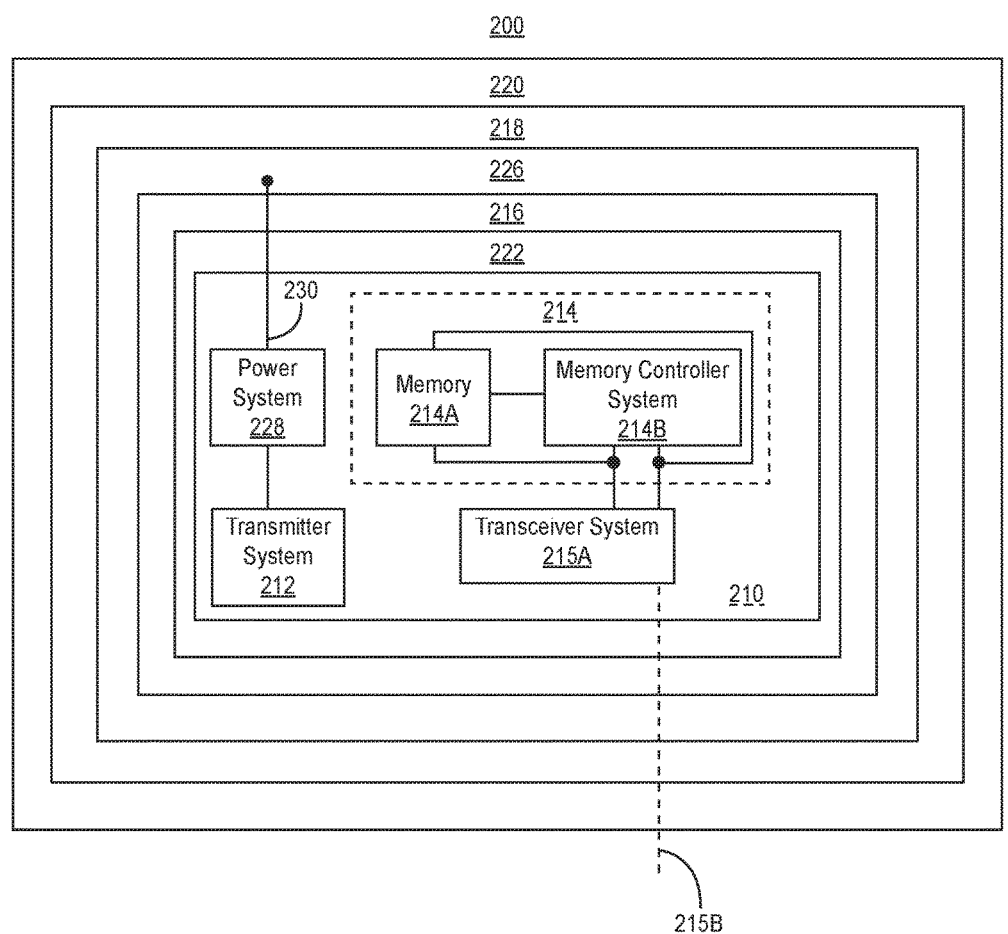
FIG. 2 is a block diagram of one embodiment of a vehicle recorder including a thermoelectric generation system.

FIG. 2 is a block diagram of one embodiment of a vehicle recorder including a thermoelectric generation system (vehicle recorder) 200. In one embodiment, the vehicle recorder is a flight recorder for an aircraft. The vehicle recorder 200 includes a crash survivable memory system (CSMS) 210. As described above with respect to FIG. 1, the vehicle recorder 200 includes a plurality of protective layers surrounding and protecting the CSMS 210: the impact resistant enclosure 220, the thermal insulator 218 (if used), the thermoelectric generation system 226, the first heat absorber 216, and/or the second heat absorber 222 (if used). The CPMS 214 also includes a transmitter system 212 coupled to the thermoelectric generation system 226. The CSMS 210 also includes a transceiver system 215A coupled to the CPMS 214. Optionally, in one embodiment, the CSMS 210 also includes a power system 228.

The transmitter system 212 is electrically coupled to and receives power from the thermoelectric generation system 226. In one embodiment, the thermoelectric generation system 226 is coupled to the transmitter system 212 by a first electrical conductor(s) 230 which pass through the first heat absorber 216 and/or the second heat absorber 222 (if used). Optionally, in one embodiment, the power system 228 couples the first electrical conductor 230 to the transmitter system 212. The power system 228 includes a voltage regulator such as a Zener diode, a low drop out regulator, or a DC-DC pulse width modulated voltage converter. The power system 228 is designed to provide a substantially constant voltage level to the transmitter system 212 when the thermoelectric generation system 226 is generating electrical power.

The transceiver system 215A includes various components for wireless and/or wireless communication with external radio system(s). In one embodiment, the transceiver system 215A includes a radio frequency (RF) antenna coupled to a data communications RF transceiver. In another embodiment, such RF communications is performed using electromagnetic radiation, e.g. in a far field (rather than near field communications such as that employing non-radiative (or reactive) coupling). To facilitate such communications, the impact resistant enclosure 220 would have to be made out of RF permeable material, or the antenna would have to be located proximate to an RF permeable window in the impact resistant enclosure. The transceiver system is configured to transmit and/or receive data respectively to and from a crash protected memory system.

Alternatively, in one embodiment, data is communicated from an external transceiver through second electrical conductor(s) 215B (passing through the impact resistant enclosure 220, the thermal insulator 218 (if used), the thermoelectric generation system 226, the first heat absorber 216, and the second heat absorber 222 (if used)) to a transceiver system 215A.

The transceiver system 215A can interface with various vehicle systems through external radio system(s). The transceiver system 112 can receive information describing the commands transmitted to different electronic systems on the vehicle, can receive audio information related to conversations between a vehicle crew and other ambient sounds in the vehicle, can receive video information from the vehicle, or other vehicle operation information. The information received by transceiver system 215A is stored in the CPMS 214. Optionally, in one embodiment, the transceiver system 215A can also transmit data from the CPMS 214 to external systems in the vehicle or elsewhere.

In one embodiment, the transceiver system 215A includes a transmitter and a receiver. The transmitter may transmit data to the external radio system(s) acknowledging data receipt. Alternatively, in another embodiment, the transceiver system 215A may only include a receiver, and thus only perform a receiving function.

The output of the transceiver system 215A is coupled to the CPMS 214, e.g. the memory 214A and/or the memory controller system 214B. In a further embodiment, electrical power is supplied by an external power source to the CPMS 214, e.g. the memory 214A and/or the memory controller system 214B, through the second electrical conductor(s) 215B; such electrical power may or may not be routed through the transceiver system 215A. In the event of the latter, the second electrical conductor(s) 215A carrying such electrical power bypasses the transceiver system 215A and are coupled to the CPMS 214, e.g. the memory 214A and/or the memory controller system 214B.

In a further embodiment, the transceiver system 215A is a near field RF transceiver, and communicates wirelessly without the use of the first electrical conductor(s) 212C; such a system is disclosed in U.S. Pat. No. 9,449,440 ('440 Patent) which is hereby incorporated by reference herein in its entirety. The transceiver system 215A receives (e.g. demodulates, detects, buffers, and/or amplifies data) and transmits (e.g. modulates, buffers, and/or amplifies data) respectively from and to the external transceiver.

In one embodiment, the transceiver system 215A includes a power receiver and power conversion system used to receive near field electromagnetic energy radiated by a power transmitter external to the vehicle recorder 200. Thus, the vehicle recorder does not necessarily need to the second electrical conductor(s) 215B to receive power.

The CPMS 214 is communicatively and electrically coupled to transceiver system 215A, so that data can be transmitted to (and possibly also from) the CPMS 214 by the transceiver system 215A. The data output of the transceiver system 215A is coupled to the CPMS 214, e.g. to the memory 214A and/or the memory controller 214B.

In one embodiment, the CPMS 214 comprises the memory 214A communicatively and electrically coupled to the memory controller 214B. The memory 214A stores data, and may be comprised of static memory such as flash memory and/or dynamic memory such as random access memory; other examples of memory are described below. The memory controller 214B (which may be otherwise known as a memory controller, memory chip controller, or memory controller unit) manages the flow of data going to and from the memory 214A, and may be integrated with or discrete from the memory 214A. For example, the memory 214A and/or the memory controller 214B may be implemented as one or more integrated circuits, e.g. fabricated using semiconductor processing technology.

Figure 3:
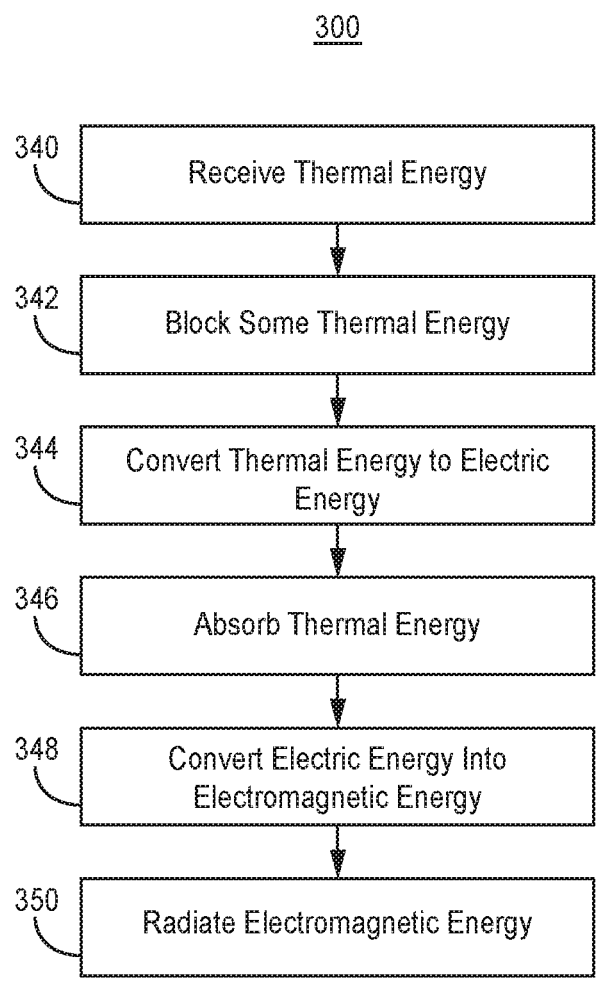
FIG. 3 illustrates one embodiment of a method of operation of a heat resistant container configured to convert thermal energy to electromagnetic energy.

FIG. 3 illustrates one embodiment of a method 300 of operation of a heat resistant container configured to convert thermal energy to electromagnetic energy. To the extent the method 300 shown in FIG. 3 is described herein as being implemented in the systems shown in FIGS. 1 and 2, it is to be understood that other embodiments can be implemented in other ways. The blocks of the flow diagrams have been arranged in a generally sequential manner for ease of explanation; however, it is to be understood that this arrangement is merely exemplary, and it should be recognized that the processing associated with the methods (and the blocks shown in the Figures) can occur in a different order (for example, where at least some of the processing associated with the blocks is performed in parallel and/or in an event-driven manner).

In one embodiment, the following blocks are performed by a heat resistant container that is a vehicle recorder 200. In block 340, receive thermal energy, e.g. by the heat resistant container. Optionally, in block 342, block some of the received thermal energy from being converted to electric energy, e.g. by a thermal insulator.

In block 344, convert all or a portion of the received thermal energy into electric energy, e.g. with a thermoelectric generation system. Optionally, in another embodiment, regulate, e.g. with a power system, a voltage level of the generated electric energy.

Optionally, in block 446, absorb, e.g. by a first heat absorber and/or a second heat absorber, some or all of the thermal energy that is not converted to electric energy. In block 448, convert the electric energy to electromagnetic energy, e.g. with a transmitter system. In block 450, radiate the electromagnetic energy outside of, e.g. the heat resistant container (for example outside of an impact resistant enclosure).

Computer(s), processor(s), and/or other state machine(s) may be used in the present systems and methods, and can be implemented using software, firmware, hardware, or any appropriate combination thereof, as known to one of skill in the art. These may be supplemented by, or incorporated in, specially-designed application-specific integrated circuits (ASICs) or field programmable gate arrays (FPGAs). The computer(s), processor(s), and/or other state machines can also include functions with software programs, firmware, or other computer readable instructions for carrying out various process tasks, calculations, and control functions used in the present method and system.

Instructions for carrying out the various process tasks, calculations, and generation of other data used in the operation of the methods described herein can be implemented in software, firmware, or other computer- or processor-readable instructions. These instructions are typically stored on any appropriate computer program product that includes a computer readable medium used for storage of computer readable instructions or data structures. Such a computer readable medium can be any available media that can be accessed by a general purpose or special purpose computer or processor, or any programmable logic device.

Suitable processor-readable media may include storage or memory media such as magnetic or optical media, and/or semiconductor memory (the latter of which is referenced above above). For example, storage or memory media may include conventional hard disks, or optical storage disks; semiconductor memory such as volatile or non-volatile media such as Random Access Memory (RAM); Read Only Memory (ROM), Electrically Erasable Programmable ROM (EEPROM), flash memory, and the like; or any other media that can be used to carry or store desired program code in the form of computer executable instructions or data structures.

Example Embodiments

Example 1 includes a heat resistant container, comprising: protected content; a transmitter system; a first heat absorber surrounding substantially all of the protected content; a thermoelectric generation system surrounding the first heat absorber and electrically coupled to the transmitter system; and an impact resistant enclosure, part or all of which is permeable to electromagnetic spectrum in which the transmitter system transmits, where the impact resistant enclosure substantially surrounds the thermoelectric generation system.

Example 2 includes the heat resistant container of Example 1, further comprising a second heat absorber surrounding substantially all of the protected content, and which is substantially surrounded by the first heat absorber.

Example 3 includes the heat resistant container of Example 2, wherein the second heat absorber comprises phase change material.

Example 4 includes the heat resistant container of any of Examples 1-3, wherein the first heat absorber comprises a metallic microlattice.

Example 5 includes the heat resistant container of any of Examples 1-4, wherein the transmitter system is configured to transmit electromagnetic energy in the ultra low frequency through millimeter wave frequency spectrum.

Example 6 includes the heat resistant container of any of Examples 1-5, further comprising a thermal insulator surrounding substantially all of the thermoelectric generation system.

Example 7 includes the heat resistant container of Example 6, wherein the thermal insulator comprises ceramic.

Example 8 includes the heat resistant container of any of Examples 6-7, wherein the thermoelectric generation system substantially surrounds the first heat absorber.

Example 9 includes the heat resistant container of any of Examples 1-8, wherein the thermoelectric generation system is a Peltier cooling system.

Example 10 includes the heat resistant container of any of Examples 1-9, wherein the heat resistant container further comprises a power system coupled between the thermoelectric generation system and the transmitter system.

Example 11 includes the heat resistant container of any of Examples 1-10, wherein the protected content is a crash survivable memory system.

Example 12 includes a method, comprising: receiving thermal energy at a heat resistant container; converting all or a portion of the received thermal energy into electric energy; converting the electric energy into electromagnetic energy; and radiating the electromagnetic energy.

Example 13 includes the method of Example 12, further comprising blocking some of the received thermal energy from being converted to the electric energy.

Example 14 includes the method of any of Examples 12-13, further comprising regulating a voltage level of the electric energy.

Example 15 includes the method of any of Examples 12-14, further comprising absorbing some or all of the thermal energy that is not converted into electric energy.

Example 16 includes a vehicle recorder, comprising: a crash survivable memory system (CSMS) comprising: a transmitter system; a crash protected memory system (CPMS); and a transceiver system; and a first heat absorber surrounding substantially all of the CSMS; a thermoelectric generation system surrounding the first heat absorber and electrically coupled to the transmitter system; and an impact resistant enclosure, part or all of which is permeable to electromagnetic spectrum in which the transmitter system transmits, where the impact resistant enclosure substantially surrounds the thermoelectric generation system.

Example 17 includes the vehicle recorder of any of Examples 1-16, further comprising a second heat absorber surrounding substantially all of the CSMS, and which is substantially surrounded by the first heat absorber.

Example 18 includes the vehicle recorder of any of Examples 1-17, wherein the transmitter system is configured to transmit electromagnetic energy in the ultra low frequency through millimeter wave frequency spectrum.

Example 19 includes the vehicle recorder of any of Examples 1-18, further comprising a thermal insulator surrounding substantially all of the thermoelectric generation system.

Example 20 includes the vehicle recorder of any of Examples 1-19, wherein the thermoelectric generation system is a Peltier cooling system.

The present invention may be embodied in other specific forms without departing from its essential characteristics. The described embodiments are to be considered in all respects only as illustrative and not restrictive. The scope of the invention is therefore indicated by the appended claims rather than by the foregoing description. All changes that come within the meaning and range of equivalency of the claims are to be embraced within their scope.

What is claimed is:

1. A heat resistant container, comprising:
   protected content;
   a transmitter system;
   a first heat absorber surrounding the protected content;
   a thermoelectric generation system surrounding the first heat absorber and electrically coupled to the transmitter system; and
   an impact resistant enclosure, part or all of which is permeable to electromagnetic spectrum in which the transmitter system transmits, where the impact resistant enclosure surrounds the thermoelectric generation system.

2. The heat resistant container of claim 1, further comprising a second heat absorber surrounding the protected content, and which is surrounded by the first heat absorber.

3. The heat resistant container of claim 2, wherein the second heat absorber comprises phase change material.

4. The heat resistant container of claim 1, wherein the first heat absorber comprises a metallic microlattice.

5. The heat resistant container of claim 1, wherein the transmitter system is configured to transmit electromagnetic energy in the ultra low frequency through millimeter wave frequency spectrum.

6. The heat resistant container of claim 1, further comprising a thermal insulator surrounding the thermoelectric generation system.

7. The heat resistant container of claim 6, wherein the thermal insulator comprises ceramic.

8. The heat resistant container of claim 6, wherein the thermoelectric generation system surrounds the first heat absorber.

9. The heat resistant container of claim 1, wherein the thermoelectric generation system is a Peltier cooling system.

10. The heat resistant container of claim 1, further comprising a power system coupled between the thermoelectric generation system and the transmitter system.

11. The heat resistant container of claim 1, wherein the protected content is a crash survivable memory system.

* * * * *